US010002667B1

(12) United States Patent
Lim et al.

(10) Patent No.: US 10,002,667 B1
(45) Date of Patent: Jun. 19, 2018

(54) MEMORY DEVICE

(71) Applicant: SK hynix Inc., Gyeonggi-do (KR)

(72) Inventors: Sang-Oh Lim, Gyeonggi-do (KR); Jong-Tai Park, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/612,734

(22) Filed: Jun. 2, 2017

(51) Int. Cl.
*G11C 16/08* (2006.01)
*G11C 16/10* (2006.01)

(52) U.S. Cl.
CPC .............. *G11C 16/08* (2013.01); *G11C 16/10* (2013.01)

(58) Field of Classification Search
CPC ................................. G11C 16/08; G11C 16/10
See application file for complete search history.

(56) References Cited

U.S. PATENT DOCUMENTS

| 8,483,005 | B2* | 7/2013 | Shin ...................... | G11C 7/1039 365/191 |
| 2011/0211397 | A1* | 9/2011 | Lee ....................... | G11C 7/1039 365/189.05 |
| 2013/0135942 | A1* | 5/2013 | Jeong ................... | G11C 7/1039 365/189.05 |
| 2015/0332742 | A1* | 11/2015 | Kim ....................... | G11C 7/109 365/189.05 |

FOREIGN PATENT DOCUMENTS

KR 1020110012421 2/2011

* cited by examiner

*Primary Examiner* — Tri Hoang
(74) *Attorney, Agent, or Firm* — IP & T Group LLP (57) ABSTRACT

A memory device may include N memory areas that are divided into a first group and a second group, and are selected by area selection signals corresponding to the N memory areas among N area selection signals, N*M pipe latches that store output data of memory areas corresponding to the N*M pipe latches among the N memory areas, a first pipe output signal generation circuit that generates $1\text{-}1^{th}$ to $1\text{-}M^{th}$ pipe output signals of pipe latches, which correspond to memory areas belonging to the first group, in response to an area selection signal corresponding to a predetermined memory area of memory areas, and a second pipe output signal generation circuit that generates $2\text{-}1^{th}$ to $2\text{-}M^{th}$ pipe output signals of pipe latches, which correspond to memory areas belonging to the second group, in response to an area selection signal corresponding to a predetermined memory area of memory areas.

10 Claims, 8 Drawing Sheets

MEMORY DEVICE

BACKGROUND

1. Field

Exemplary embodiments relate to a memory device, and more particularly, to a pipe latch for controlling data output of a memory device.

2. Description of the Related Art

In general, a synchronous memory device has pipe latches for continuous data input/output. The pipe latches store data read from memory cells and sequentially output the stored data at a predetermined timing.

SUMMARY

Various embodiments are directed to a technology for securing a sufficient timing margin for output of data stored in pipe latches.

A memory in accordance with an embodiment may include N memory areas divided into a first group and a second group, and selected by N area selection signals, respectively, wherein N is an integer equal to or greater than 4; N pipe latch groups each having M pipe latches, suitable for storing output data of a corresponding memory area among the N memory areas, wherein M is s an integer equal to or greater than 2; a first pipe output signal generation circuit suitable for generating first pipe output signals of a pipe latch group among the N pipe latch groups corresponding to a memory area included in the first group in response to an area selection signal corresponding to a second reference memory area included the second group; and a second pipe output signal generation circuit suitable for generating second pipe output signals of the pipe latch group among the N pipe latch groups corresponding to a memory area included in the second group in response to an area selection signal corresponding to a first reference memory area included in the first group.

The memory device may further include a data output circuit suitable for outputting data of an enabled pipe latch group among the N pipe latch groups corresponding to one among the N memory areas corresponding to an enabled area selection signal among the N area selection signals.

The first pipe output signal generation circuit may sequentially activate the first pipe output signals in response to an area selection signal among the N area selection signals corresponding to the second reference memory area.

The second pipe output signal generation circuit may sequentially activate the second pipe output signals in response to an area selection signal among the N area selection signals corresponding to the first reference memory area.

The first pipe output signal generation circuit may include M first shift register units electrically coupled to one another in a ring shape, wherein the M first shift register units may perform a shift operation when an area selection signal among the N area selection signals corresponding to the second reference memory area may be activated, and output signals of the M first shift register units may be the first pipe output signals.

Each of the first shift register units may include a D flip-flop.

The second pipe output signal generation circuit may comprise M second shift register units electrically coupled to one another in a ring shape, wherein the M second shift register units may perform a shift operation when an area selection signal among the N area selection signals corresponding to the first reference memory area may be activated, and output signals of the M second shift register units may be the second pipe output signals.

Each of the second shift register units includes a D flip-flop.

The second pipe output signal generation circuit may further include a blocking unit suitable for preventing shift operations of the M second shift register units before data of the second group is initially outputted when data of the first group is to be outputted prior to the data of the second group.

Each of the N memory areas includes a memory bank.

According to embodiments, it is possible to ensure a sufficient timing margin in the output of data stored in pipe latches.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
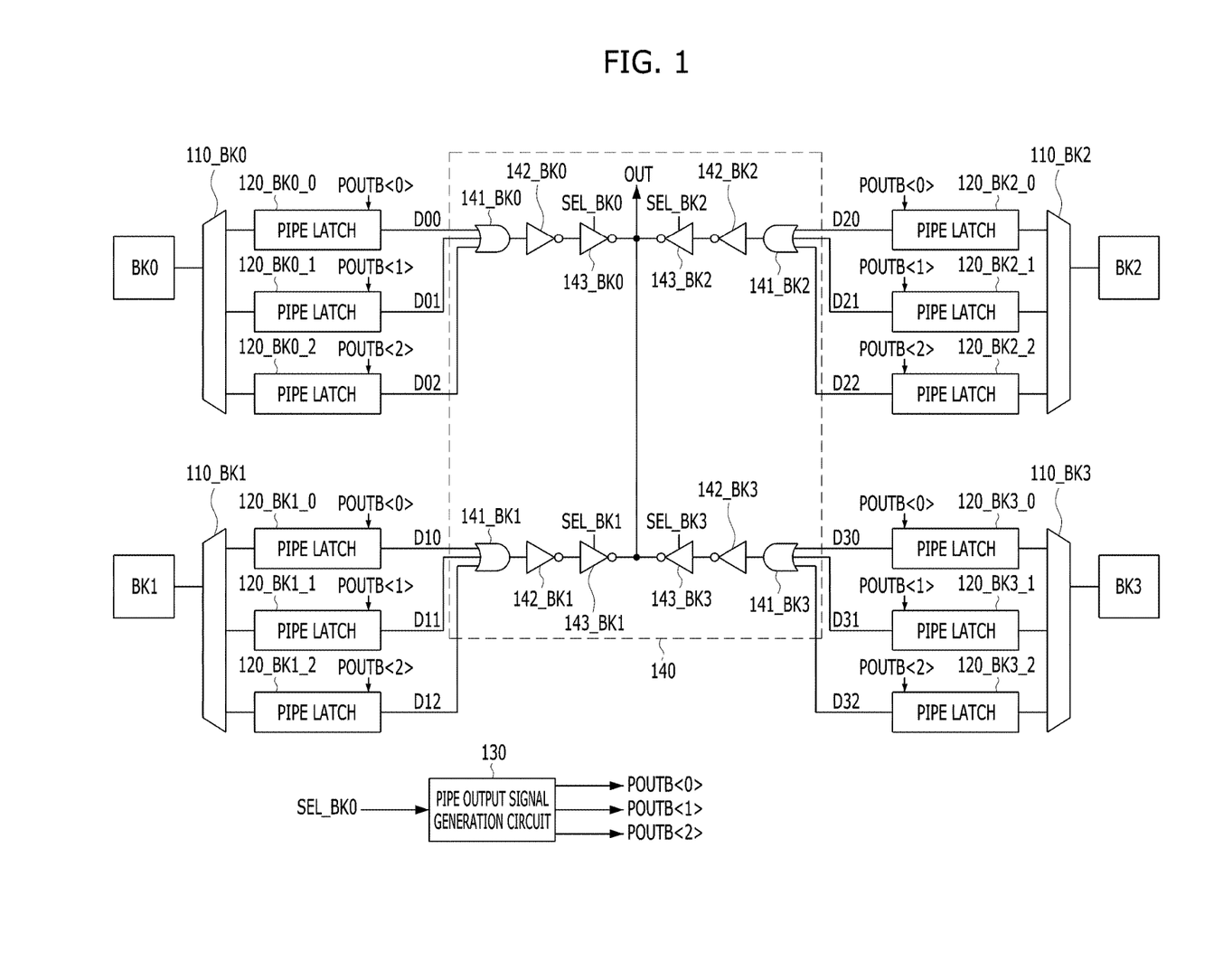
FIG. 1 is a logic block diagram illustrating a memory device in accordance with an embodiment.

FIG. 1 is a logic block diagram illustrating a memory device in accordance with an embodiment.

Referring FIG. 1, the memory device may include a plurality of memory areas BK0 to BK3, pipe input control units 110_BK0 to 110_BK3, a plurality of pipe latches 120_BK0_0 to 120_BK0_2, 120_BK1_0 to 120_BK1_2, 120_BK2_0 to 120_BK2_2, and 120_BK3_0 to 120_BK3_2, a pipe output signal generation circuit 130, and a data output circuit 140.

The plurality of memory areas BK0 to BK3 may include a plurality of memory cells for storing data, respectively. Each of the plurality of memory areas BK0 to BK3 may be a memory bank. In the embodiment, each of the plurality of memory areas BK0 to BK3 is the memory bank; however, each of the plurality of memory areas BK0 to BK3 may be a larger or smaller set of memory cells than the memory bank. In the embodiment, the number of the memory areas BK0 to BK3 is 4; however, the number of the memory areas BK0 to BK3 may be larger than 4.

The plurality of pipe latches 120_BK0_0 to 120_BK0_2, 120_BK1_0 to 120_BK1_2, 120_BK2_0 to 120_BK2_2, and 120_BK3_0 to 120_BK3_2 may store data which is read from corresponding memory areas among the memory areas BK0 to BK3. One memory area may correspond to three pipe latches. For example, the pipe latches 120_BK0_0 to 120_BK0_2 may correspond to the memory area BK0 and the pipe latches 120_BK2_0 to 120_BK2_2 may correspond to the memory area BK2.

Data read from the memory areas BK0 to BK3 may be sequentially stored in the pipe latches 120_BK0_0 to 120_BK0_2, 120_BK1_0 to 120_BK1_2, 120_BK2_0 to 120_BK2_2, and 120_BK3_0 to 120_BK3_2, by the pipe input control units 110_BK0 to 110_BK3, respectively. For example, the first data read from the memory area BK1 may be stored in the pipe latches 120_BK1_0, the second data may be stored in the pipe latches 120_BK1_1, and the third data may be stored in the pipe latches 120_BK1_2. Furthermore, the fourth data read from the memory area BK1 may be stored in the pipe latches 120_BK1_0 again. In the embodiment, three pipe latches are assigned to each of the memory areas BK0 to BK3; however, this is for illustrative purposes only and the number of pipe latches to be assigned to each of the memory areas BK0 to BK3 may vary.

Data stored in the plurality of pipe latches 120_BK0_0 to 120_BK0_2, 120_BK1_0 to 120_BK1_2, 120_BK2_0 to 120_BK2_2, and 120_BK3_0 to 120_BK3_2 may be outputted when corresponding pipe output signals POUTB<0> to POUTB<2> are enabled. For example, when the pipe output signal POUTB<0> is enabled, the data stored in the plurality of pipe latches 120_BK0_0, 120_BK1_0, 120_BK2_0, and 120_BK3_0 may be outputted. For example, when the pipe output signal POUTB<1> is enabled, the data stored in the plurality of pipe latches 120_BK0_1, 120_BK1_1, 120_BK2_1, and 120_BK3_1 may be outputted.

The pipe output signal generation circuit 130 may generate the pipe output signals POUTB<0> to POUTB<2> by using an area selection signal SEL_BK0 of the memory area BK0. The pipe output signal generation circuit 130 may sequentially enable the three pipe output signals POUTB<0> to POUTB<2> in response to the area selection signal SEL_BK0 of the memory area BK0. The pipe output signal generation circuit 130 will be described with reference to FIG. 2 in more detail.

The data output circuit 140 may provide an exterior of the memory device with data which is activated among pipe latches of a memory area corresponding to enabled area selection signals of the area selection signals SEL_BK0 to SEL_BK3. For example, when the area selection signal SEL_BK1 and the pipe output signal POUTB<1> are enabled, data of the memory area BK1 stored in the pipe latch 120_BK1_1 may be outputted, and when the area selection signal SEL_BK3 and the pipe output signal POUTB<0> are enabled, data of the memory area BK0 stored in the pipe latch 120_BK3_0 may be outputted. The data output circuit 140 may include OR gates 141_BK0 to 141_BK3, inverters 142_BK0 to 142_BK3, and tri-state inverters 143_BK0 to 143_BK3. The area selection signals SEL_BK0 to SEL_BK3 may respectively select the memory areas BK0 to BK3, which include data to be outputted to an exterior.

Figure 2:
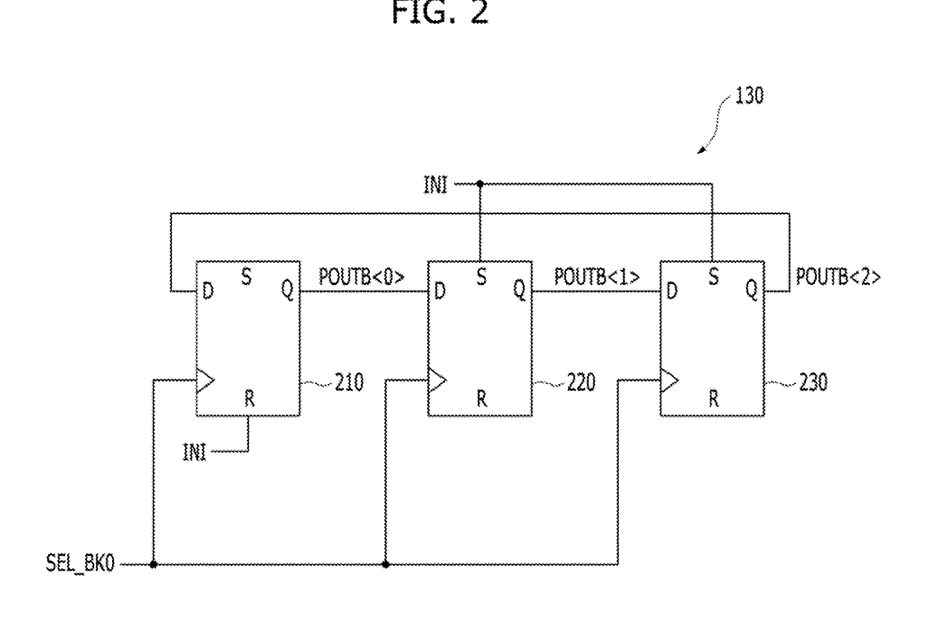
FIG. 2 is a logic block diagram illustrating a pipe output signal generation circuit 130 of FIG. 1.

FIG. 2 is a logic block diagram illustrating the pipe output signal generation circuit 130 of FIG. 1.

Referring to FIG. 2, the pipe output signal generation circuit 130 may include shift register units 210, 220, and 230 electrically coupled to one another in a ring shape. Output signals of the shift register units 210, 220, and 230 may be the pipe output signals POUTB<0>, POUTB<1>, and POUTB<2>, respectively. Each of the shift register units 210, 220, and 230 may be a D flip-flop.

The shift register units 210, 220, and 230 may be initialized by an initialization signal INI. When the initialization signal INI is enabled, the pipe output signal POUTB<0>, which is the output signal of the shift register unit 210, may be initialized to a low level and the pipe output signals POUTB<1> and POUTB<2>, which are the output signals of the shift register units 220 and 230, may be initialized to a high level.

The shift register units 210, 220, and 230 may perform a shift operation in response to the area selection signal SEL_BK0. Accordingly, whenever the area selection signal SEL_BK0 is enabled, a signal, which is enabled to a low level among the pipe output signals POUTB<0>, POUTB<1>, and POUTB<2>, may be changed. That is, immediately after the initialization signal INI is enabled, the pipe output signal POUTB<0> may be initialized to a low level, and when the area selection signal SEL_BK0 is firstly enabled, the pipe output signal POUTB<1> may be enabled to a low level. When the area selection signal SEL_BK0 is secondly enabled, the pipe output signal POUTB<2> may be enabled to a low level. Furthermore, when the area selection signal SEL_BK0 is thirdly enabled, the pipe output signal POUTB<0> may be enabled to a low level again.

Figure 3:
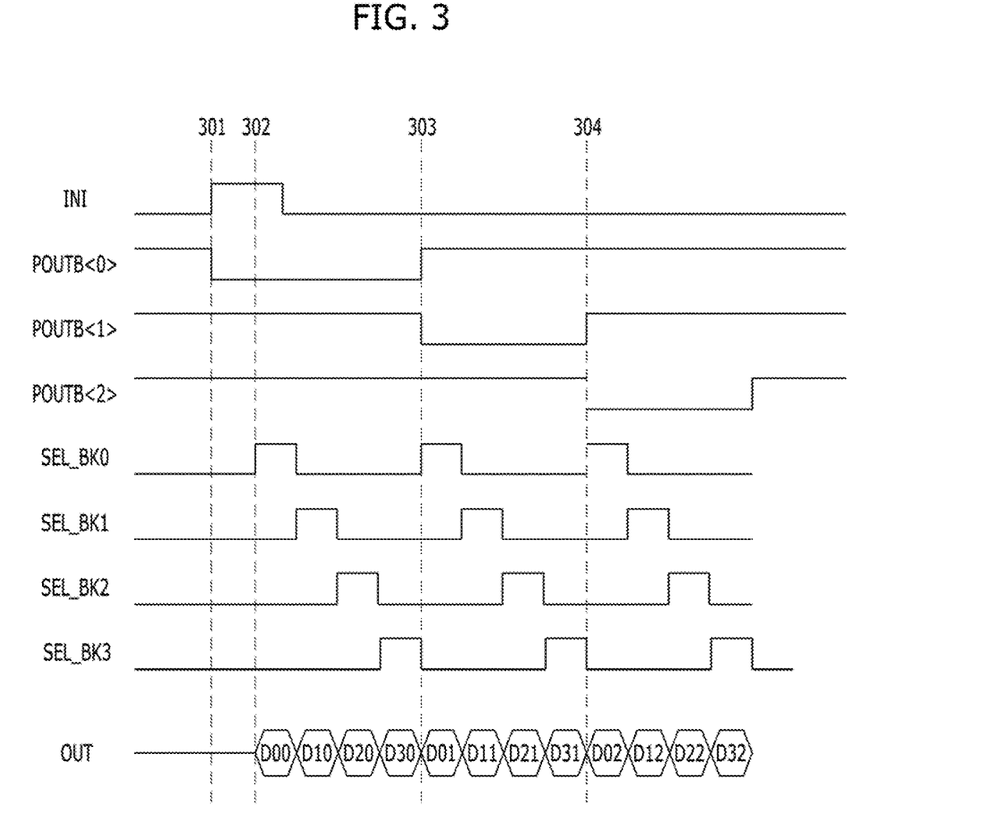
FIG. 3 is a timing diagram illustrating an operation of the memory device of FIG. 1.

FIG. 3 is a timing diagram illustrating the operation of the memory device of FIG. 1.

Referring to FIG. 3, at the time point '301', the initialization signal INI is enabled to a high level so that the pipe output signal POUTB<0> is enabled to a low level.

Since the area selection signal SEL_BK0 is enabled to a high level at the time point '302' but the initialization signal INI is still in the enabled state, the pipe output signal POUTB<0> substantially stays enabled to a low level. When the area selection signal SEL_BK0 has been enabled to a high level and the pipe output signal POUTB<0> has been enabled to a low level, data D00 of the memory area BK0 stored in the pipe latch 120_BK0_0 may be outputted. When the pipe output signal POUTB<0> has been enabled to a low level, the area selection signals SEL_BK1 to SEL_BK3 may be sequentially enabled to a high level so that data D10, D20, and D30 of the memory areas BK1 to BK3 stored in the pipe latches 120_BK1_0, 120_BK2_0, and 120_BK3_0 may be sequentially outputted to an output terminal OUT.

At the time point '303', the area selection signal SEL_BK0 may be enabled to a high level so that the pipe output signal POUTB<1> may be enabled to a low level. When the area selection signal SEL_BK0 has been enabled to a high level and the pipe output signal POUTB<1> has been enabled to a low level, data D01 of the memory area BK0 stored in the pipe latch 120_BK0_1 may be outputted. When the pipe output signal POUTB<1> has been enabled to a low level, the area selection signals SEL_BK1 to SEL_BK3 may be sequentially enabled to a high level, so that data D11, D21, and D31 of the memory areas BK1 to BK3 stored in the pipe latches 120_BK1_1, 120_BK2_1, and 120_BK3_1 may be sequentially outputted.

At the time point '304', the area selection signal SEL_BK0 may be enabled to a high level and the pipe output signal POUTB<2> may be enabled to a low level. When the area selection signal SEL_BK0 has been enabled to a high level and the pipe output signal POUTB<2> has been enabled to a low level, data D02 of the memory area BK0 stored in the pipe latch 120_BK0_2 may be outputted. When the pipe output signal POUTB<2> has been enabled to a low level, the area selection signals SEL_BK1 to SEL_BK3 may be sequentially enabled to a high level so that data D12, D22, and D32 of the memory areas BK1 to BK3 stored in the pipe latches 120_BK1_2, 120_BK2_2, and 120_BK3_2 may be sequentially outputted.

At the time points '303' and '304', two or more signals for controlling data output are shifted. At the time point '303', the pipe output signal POUTB<1> and the area selection signal SEL_BK0 are shifted. At the time point '304', the pipe output signal POUTB<2> and the area selection signal SEL_BK0 are shifted. Therefore, there may occur a problem that windows of data D30, D01, D31, and D02 at the time points '303' and '304' are reduced.

Figure 4:
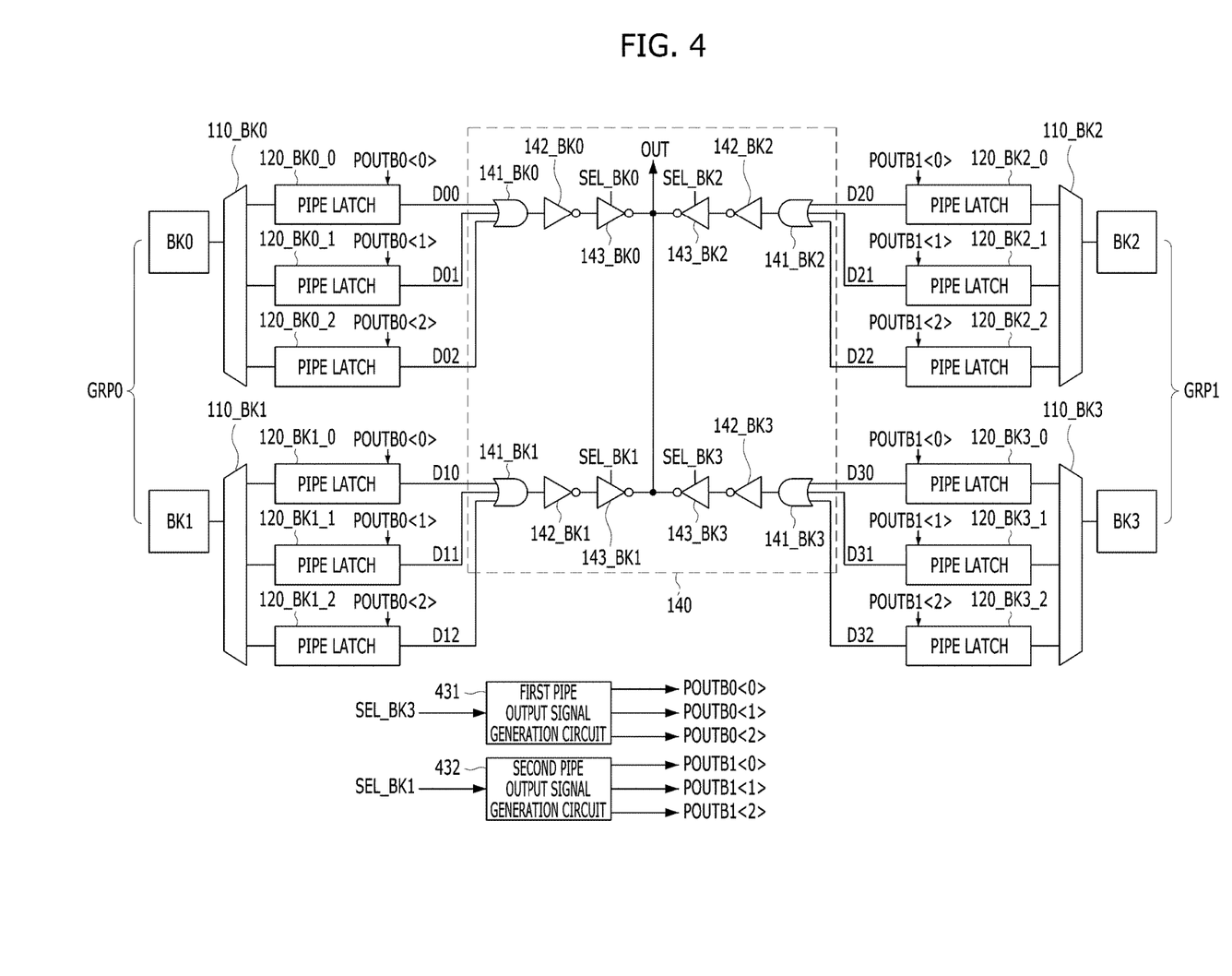
FIG. 4 is a logic block diagram illustrating a memory device in accordance with another embodiment.

FIG. 4 is a logic block diagram illustrating a memory device in accordance with another embodiment.

Referring FIG. 4, the memory device may include memory areas BK0 and BK1 of a first group GRP0, memory areas BK2 and BK3 of a second group GRP1, pipe input control units 110_BK0 to 110_BK3, a plurality of pipe latches 120_BK0_0 to 120_BK0_2, 120_BK1_0 to 120_BK1_2, 120_BK2_0 to 120_BK2_2, and 120_BK3_0 to 120_BK3_2, a first pipe output signal generation circuit 431, a second pipe output signal generation circuit 432, and a data output circuit 140.

The memory device of FIG. 4 is different from the memory device of FIG. 1 in that the memory areas BK0 to BK3 are divided into the first group GRP0 and the second group GRP1 and the pipe latches 120_BK0_0 to 120_BK0_2 and 120_BK1_0 to 120_BK1_2 of the first group GRP0 and the pipe latches 120_BK2_0 to 120_BK2_2 and 120_BK3_0 to 120_BK3_2 of the second group GRP1 are controlled by pipe output signals different from each other.

The pipe latches 120_BK0_0 to 120_BK0_2 and 120_BK1_0 to 120_BK1_2 of the first group GRP0 may be controlled by $1\text{-}1^{th}$ to $1\text{-}3^{th}$ pipe output signals POUTB0<0> to POUTB0<2> generated by the first pipe output signal generation circuit 431.

The pipe latches 120_BK2_0 to 120_BK2_2 and 120_BK3_0 to 120_BK3_2 of the second group GRP1 may be controlled by $2\text{-}1^{th}$ to $2\text{-}3^{th}$ pipe output signals POUTB1<0> to POUTB1<2> generated by the second pipe output signal generation circuit 432.

The first pipe output signal generation circuit 431 may generate the $1\text{-}1^{th}$ to $1\text{-}3^{th}$ pipe output signals POUTB0<0> to POUTB0<2> in response to the area selection signal SEL_BK3 of the memory area BK3 which is one of the memory areas BK2 and BK3 belonging to the second group GRP1.

The second pipe output signal generation circuit 432 may generate the $2\text{-}1^{th}$ to $2\text{-}3^{th}$ pipe output signals POUTB1<0> to POUTB1<2> in response to the area selection signal SEL_BK1 of the memory area BK1 which is one of the memory areas BK0 and BK1 belonging to the first group GRP0.

That is, the first pipe output signal generation circuit 431 and the second pipe output signal generation circuit 432 may generate pipe output signals by using area selection signals of groups different from each other.

Figure 5:
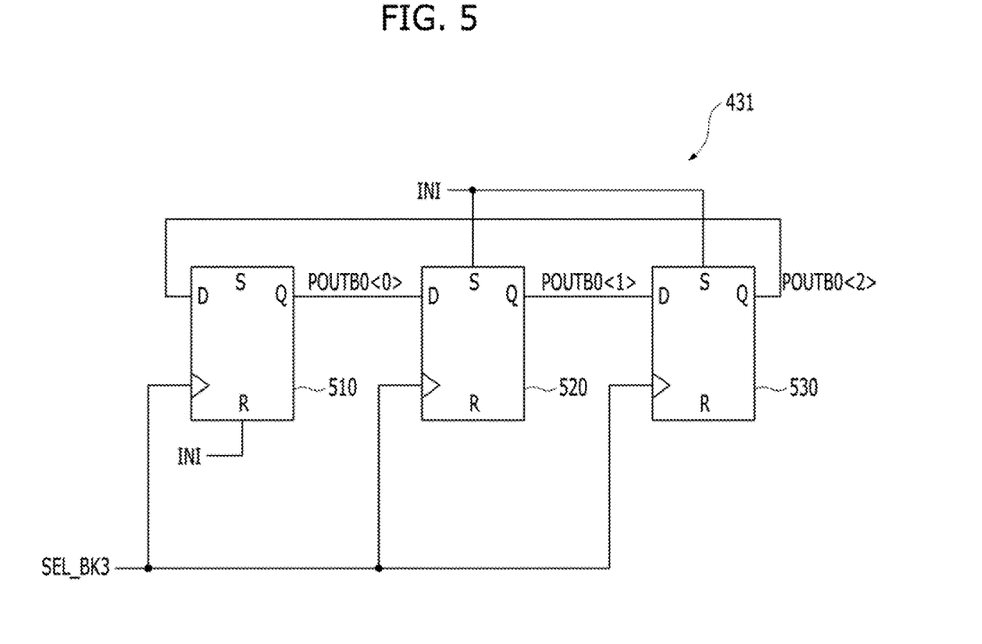
FIG. 5 is a logic block diagram illustrating a first pipe output signal generation circuit of FIG. 4.

FIG. 5 is a logic block diagram illustrating the first pipe output signal generation circuit 431 of FIG. 4.

Referring to FIG. 5, the first pipe output signal generation circuit 431 may include first shift register units 510, 520, and 530 electrically coupled to one another in a ring shape. Output signals of the first shift register units 510, 520, and 530 may be the $1\text{-}1^{th}$ to $1\text{-}3^{th}$ pipe output signals POUTB0<0>, POUTB0<1>, and POUTB0<2>, respectively. Each of the first shift register units 510, 520, and 530 may be a D flip-flop.

The first shift register units 510, 520, and 530 may be initialized by an initialization signal INI. When the initialization signal INI is enabled, the $1\text{-}1^{th}$ pipe output signal POUTB0<0>, which is the output signal of the first shift register unit 510, may be initialized to a low level and the $1\text{-}2^{th}$ and $1\text{-}3^{th}$ pipe output signals POUTB0<I> and POUTB0<2>, which are the output signals of the first shift register units 520 and 530, may be initialized to a high level.

The first shift register units 510, 520, and 530 may perform a shift operation in response to the area selection signal SEL_BK3. Accordingly, whenever the area selection signal SEL_BK3 is enabled, a signal, which is enabled to a low level, among the $1\text{-}1^{th}$ to $1\text{-}3^{th}$ pipe output signals POUTB0<0>, POUTB0<1>, and POUTB0<2>, may be changed. That is, immediately after the initialization signal INI is enabled, the $1\text{-}1^{th}$ pipe output signal POUTB0<0> may be initialized to a low level, and when the area selection signal SEL_BK3 is firstly enabled, the $1\text{-}2^{th}$ pipe output signal POUTB0<1> may be enabled to a low level. When the area selection signal SEL_BK3 is secondly enabled, the $1\text{-}3^{th}$ pipe output signal POUTB0<2> may be enabled to a low level. Furthermore, when the area selection signal SEL_BK3 is thirdly enabled, the $1\text{-}1^{th}$ pipe output signal POUTB0<0> may be enabled to a low level again.

Figure 6:
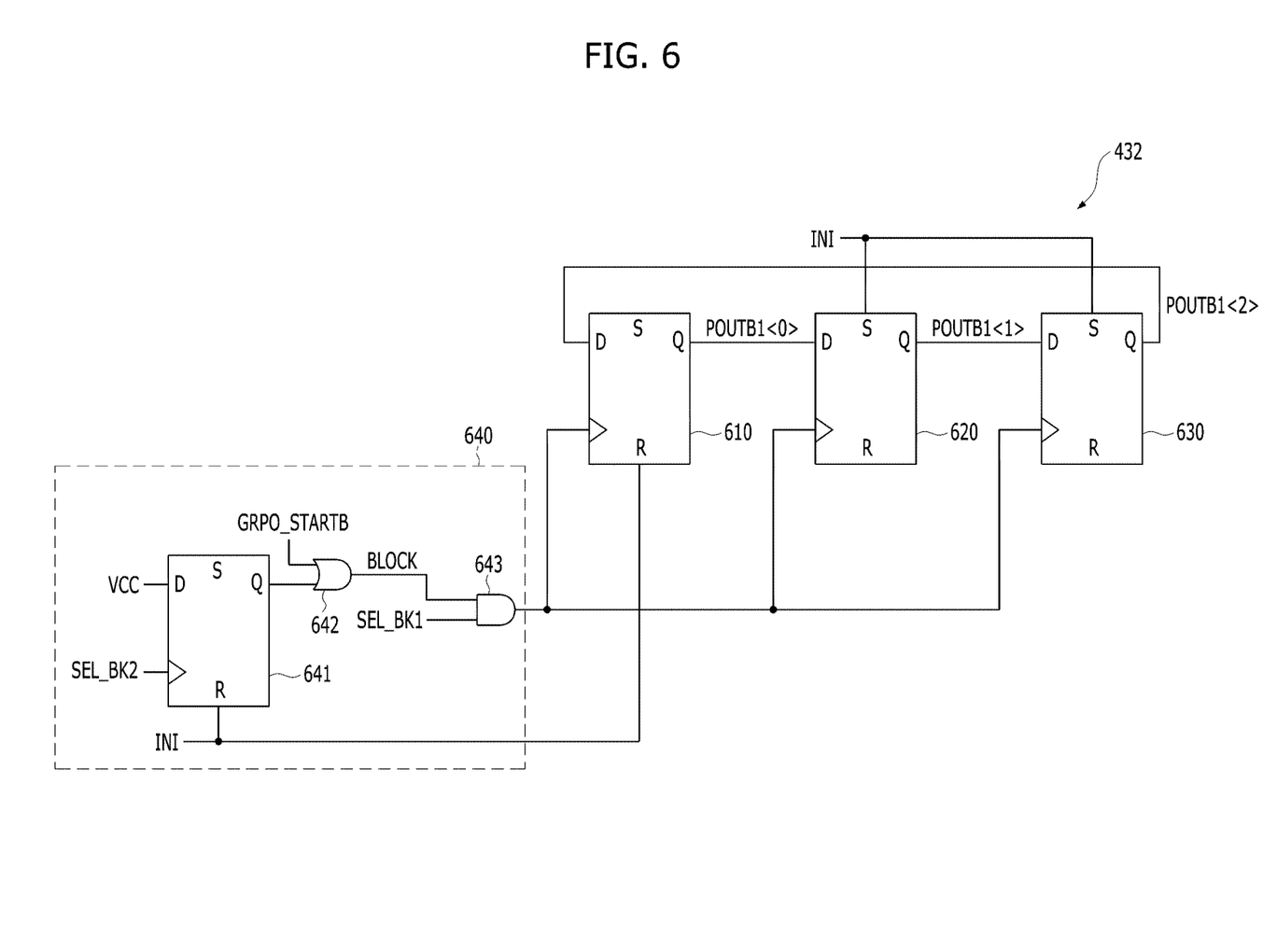
FIG. 6 is a logic block diagram illustrating a second pipe output signal generation circuit of FIG. 4.

FIG. 6 is a logic block diagram illustrating the second pipe output signal generation circuit 432 of FIG. 4.

Referring to FIG. 6, the second pipe output signal generation circuit 432 may include second shift register units 610, 620, and 630 electrically coupled to one another in a ring shape. Output signals of the second shift register units 610, 620, and 630 may be the $2\text{-}1^{th}$ to $2\text{-}3^{th}$ pipe output signals POUTB1<0>, POUTB1<1>, and POUTB1<2>, respectively. Each of the second shift register units 610, 620, and 630 may be a D flip-flop.

The second shift register units 610, 620, and 630 may be initialized by the initialization signal INI. When the initialization signal INI is enabled, the $2\text{-}1^{th}$ pipe output signal POUTB1<0>, which is the output signal of the second shift register unit 610, may be initialized to a low level and the $2\text{-}2^{th}$ and $2\text{-}3^{th}$ pipe output signals POUTB1<1> and POUTB1<2>, which are the output signals of the second shift register units 620 and 630, may be initialized to a high level.

The second shift register units 610, 620, and 630 may perform a shift operation in response to the area selection signal SEL_BK1. Accordingly, whenever the area selection signal SEL_BK1 is enabled, a signal, which is enabled to a low level, among the $2\text{-}1^{th}$ to $2\text{-}3^{th}$ pipe output signals POUTB1<0>, POUTB1<1>, and POUTB1<2>, may be changed. That is, immediately after the initialization signal INI is enabled, the $2\text{-}1^{th}$ pipe output signal POUTB1<0> may be initialized to a low level, and when the area selection signal SEL_BK1 is firstly enabled, the $2\text{-}2^{th}$ pipe output signal POUTB1<1> may be enabled to a low level. When the area selection signal SEL_BK1 is secondly enabled, the $2\text{-}3^{th}$ pipe output signal POUTB1<2> may be enabled to a low level. Furthermore, when the area selection signal SEL_BK1 is thirdly enabled, the $2\text{-}1^{th}$ pipe output signal POUTB1<0> may be enabled to a low level again.

The second pipe output signal generation circuit 432 may further include a blocking unit 640. The blocking unit 640 may block the shift operations of the second shift register units 610, 620, and 630 before data of the second group GRP1 is initially outputted when data of the first group GRP0 needs to be outputted prior to the data of the second group GRP1 that is, when a start address corresponds to the memory area of the second group GRP1. A first group start signal GRP0_STARTB may be enabled to a low level when the data of the first group GRP0 needs to be outputted prior to the data of the second group GRP1. When the first group start signal GRP0_STARTB is enabled, the blocking unit 640 may enable a blocking signal BLOCK before the area selection signal SEL_BK2 is enabled, thereby substantially preventing the shift operations of the second shift register units 610, 620, and 630 even though the area selection signal SEL_BK1 is enabled. The blocking unit 640 may include a D flip-flop 641, an OR gate 642, and an AND gate 643.

Figure 7:
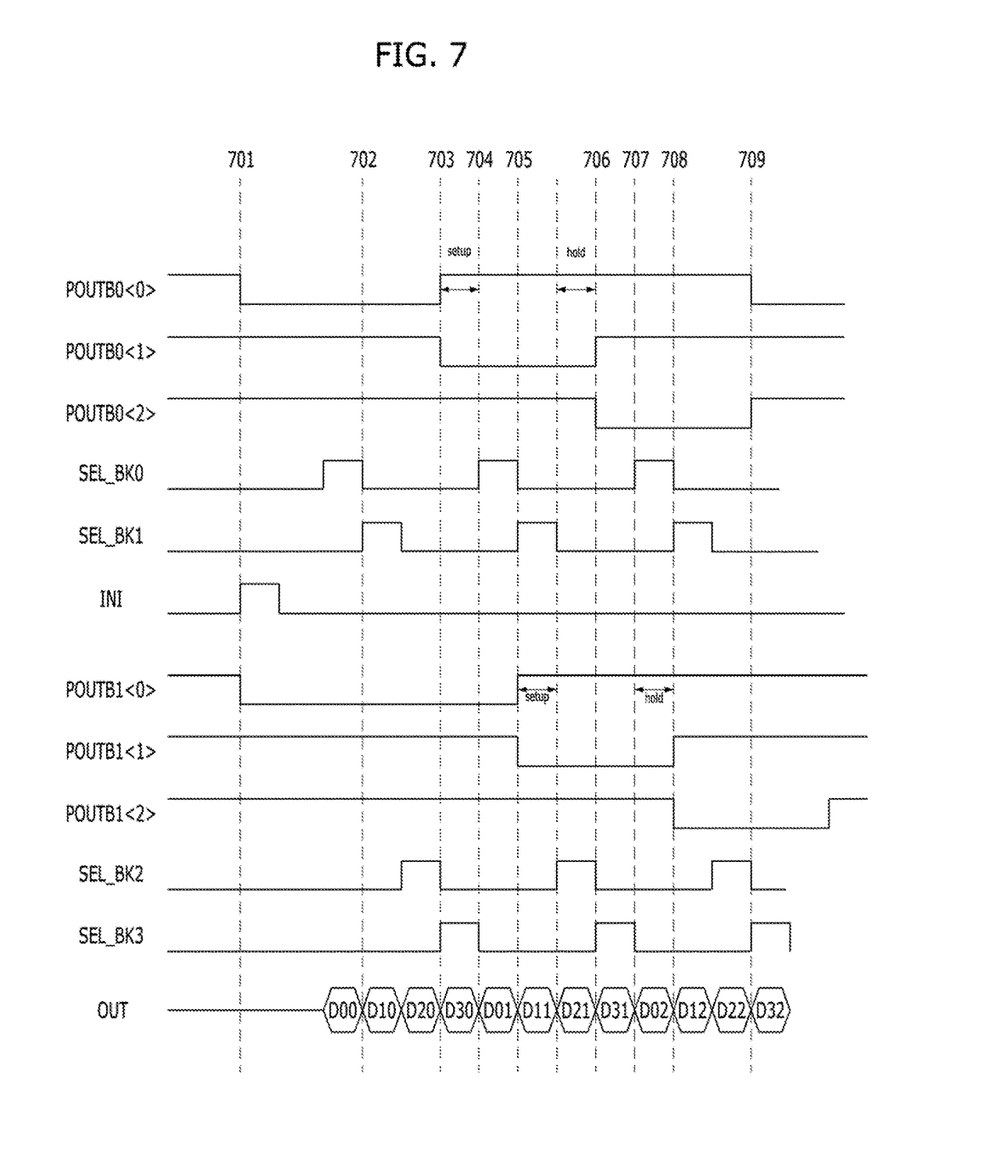
FIGS. 7 and 8 are timing diagrams illustrating an operation of the memory device of FIG. 4.

FIG. 7 is a timing diagram illustrating the operation of the memory device of FIG. 4. FIG. 7 illustrates an operation when data is firstly outputted from the first group GRP0.

Referring to FIG. 7, at the time point '701', the initialization signal INI is enabled to a high level so that the $1\text{-}1^{th}$ pipe output signal POUTB0<0> and the $2\text{-}1^{th}$ pipe output signal POUTB1<0> may be enabled to a low level.

After the initialization signal INI is enabled, the area selection signal SEL_BK0 to SEL_BK3 may be sequentially enabled. When the activation periods of the area selection signals SEL_BK0 and SEL_BK1 overlap the activation period of the $1\text{-}1^{th}$ pipe output signal POUTB0<0>, the data D00 and D10 stored in the pipe latches 120_BK0_0 and 120_BK1_0 may be outputted to the output terminal OUT. When the activation periods of the area selection signals SEL_BK2 and SEL_BK3 overlap the activation period of the $2\text{-}1^{th}$ pipe output signal POUTB1<0>, the data D20 and D30 stored in the pipe latches 120_BK2_0 and 120_BK3_0 may be outputted to the output terminal OUT.

At the time point '702', even though the area selection signal SEL_BK1 is enabled, the $2\text{-}2^{th}$ pipe output signal POUTB1<1> may not be enabled. This is due to the blocking unit 640 blocking the shift operations of the second shift register units 610, 620, and 630 when the data of the first group GRP0 is outputted prior to the data of the second group GRP1 and the area selection signal SEL_BK1 is firstly enabled.

At the time point '703', the area selection signal SEL_BK3 is enabled so that the $1\text{-}2^{th}$ pipe output signal POUTB0<1> may be enabled.

From the time point '704', the area selection signals SEL_BK0 to SEL_BK3 may be enabled again. When the activation periods of the area selection signals SEL_BK0 and SEL_BK1 overlap the activation period of the $1\text{-}2^{th}$ pipe output signal POUTB0<1>, the data D01 and D11 stored in the pipe latches 120_BK0_1 and 120_BK1_1 may be outputted to the output terminal OUT.

At the time point '705', the area selection signal SEL_BK1 is enabled so that the $2\text{-}2^{th}$ pipe output signal POUTB1<1> may be enabled. When the activation periods of the area selection signal SEL_BK2 and SEL_BK3 overlap the activation period of the $2\text{-}2^{th}$ pipe output signal POUTB1<1>, the data D21 and D31 stored in the pipe latches 120_BK2_1 and 120_BK3_1 may be outputted to the output terminal OUT.

At the time point '706', the area selection signal SEL_BK3 is enabled so that the $1\text{-}3^{th}$ pipe output signal POUTB0<2> may be enabled.

From the time point '707', the area selection signals SEL_BK0 to SEL_BK3 may be enabled again. When the activation periods of the area selection signals SEL_BK0 and SEL_BK1 overlap the activation period of the $1\text{-}3^{th}$ pipe output signal POUTB0<2>, the data D02 and D12 stored in the pipe latches 120_BK0_2 and 120_BK1_2 may be outputted to the output terminal OUT.

At the time point '708', the area selection signal SEL_BK1 is enabled so that the $2\text{-}3^{th}$ pipe output signal POUTB1<2> may be enabled. When the activation periods of the area selection signal SEL_BK2 and SEL_BK3 overlap the activation period of the $2\text{-}3^{th}$ pipe output signal POUTB1<2>, the data D22 and D32 stored in the pipe latches 120_BK2_2 and 120_BK3_2 may be outputted to the output terminal OUT.

At the time point '709', the area selection signal SEL_BK3 is enabled so that the $1\text{-}1^{th}$ pipe output signal POUTB0<0> may be enabled.

Referring to the timing diagram of FIG. 7, two or more signals for controlling data output are not shifted at a time. For example, the $1\text{-}1^{th}$ to $1\text{-}3^{th}$ pipe output signals POUTB0<0> to POUTB0<2> and the area selection signal SEL_BK0 and SEL_BK1 are not simultaneously shifted, and the $2\text{-}1^{th}$ to $2\text{-}3^{th}$ pipe output signals POUTB1<0> to POUTB1<2> and the area selection signal SEL_BK2 and SEL_BK3 are not simultaneously shifted. Thus, a setup margin and a hold margin may be secured as compared with the case of FIG. 4, thereby substantially preventing the reduction of a data window.

Figure 8:
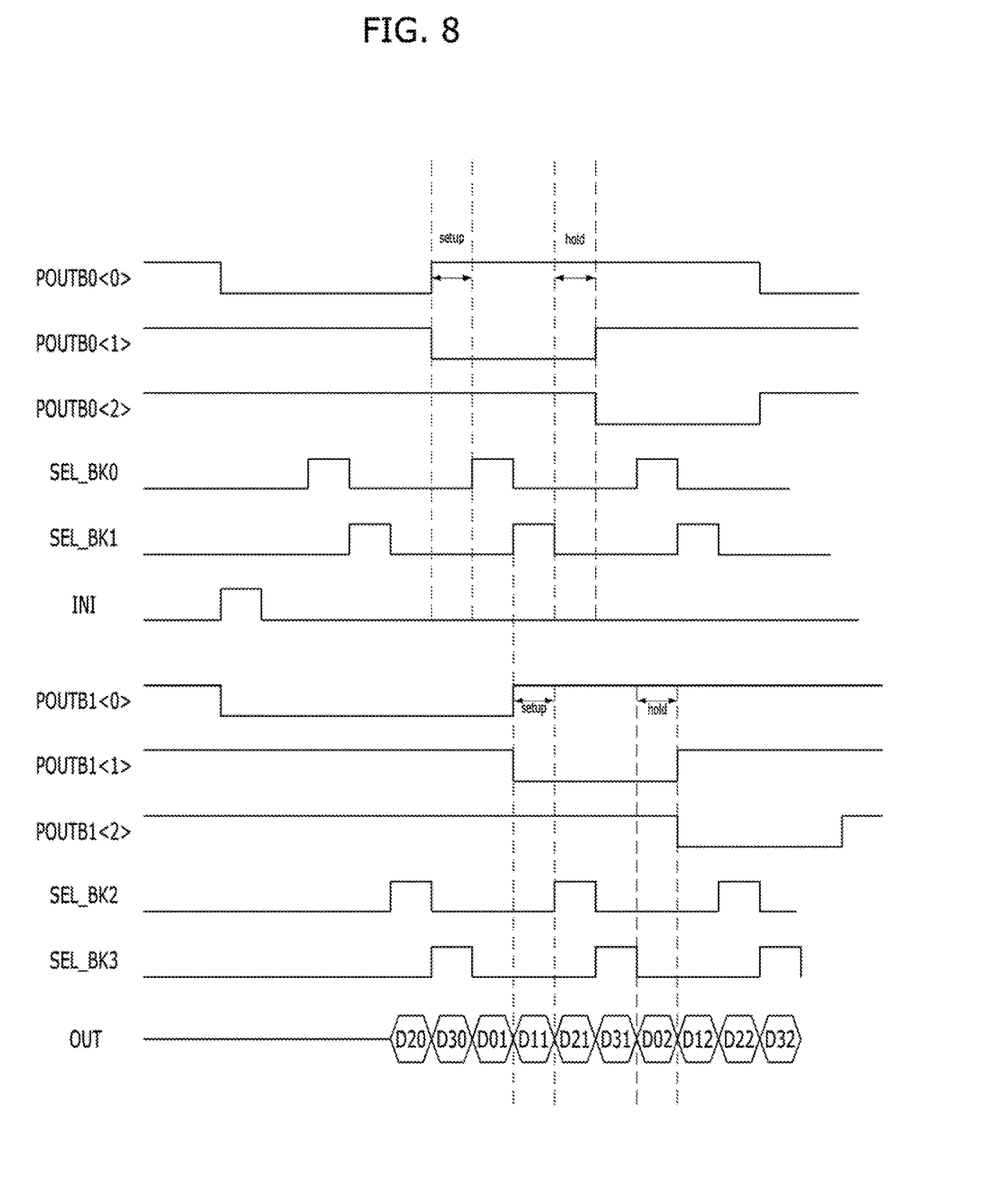

FIG. 8 is a timing diagram illustrating the operation of the memory device of FIG. 4. FIG. 8 illustrates an operation when data is firstly outputted from the second group GRP1.

The operation of FIG. 8 may be similar to that of FIG. 7 except that initially outputted data D20 and D30 are data of the memory areas BK2 and BK3 of the second group GRP1 and the blocking unit 640 does not operate. Similarly to FIG. 7, in the case of FIG. 8, it can be understood that sufficient setup margin and hold margin are secured, thereby substantially preventing the reduction of a data window.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
    N memory areas divided into a first group and a second group, and selected by N area selection signals, respectively, wherein N is an integer equal to or greater than 4;
    N pipe latch groups each having M pipe latches, suitable for storing output data of a corresponding memory area among the N memory areas, wherein M is an integer equal to or greater than 2;
    a first pipe output signal generation circuit suitable for generating first pipe output signals of a pipe latch group among the N pipe latch groups corresponding to a memory area included in the first group in response to an area selection signal corresponding to a second reference memory area included the second group; and
    a second pipe output signal generation circuit suitable for generating second pipe output signals of the pipe latch group among the N pipe latch groups corresponding to a memory area included in the second group in response to an area selection signal corresponding to a first reference memory area included in the first group.

2. The memory device of claim 1, further comprising a data output circuit suitable for outputting data of an enabled pipe latch group among the N pipe latch groups corresponding to one among the N memory areas corresponding to an enabled area selection signal among the N area selection signals.

3. The memory device of claim 1, wherein the first pipe output signal generation circuit sequentially activates the first pipe output signals in response to the area selection signal among the N area selection signals corresponding to the second reference memory area.

4. The memory device of claim 3, wherein the second pipe output signal generation circuit sequentially activates the second pipe output signals in response to the area selection signal among the N area selection signals corresponding to the first reference memory area.

5. The memory device of claim 3,
wherein the first pipe output signal generation circuit comprises M first shift register units electrically coupled to one another in a ring shape,
wherein the M first shift register units perform a shift operation when the area selection signal among the N area selection signals corresponding to the second reference memory area is activated, and
output signals of the M first shift register units are the first pipe output signals.

6. The memory device of claim 5, wherein each of the M first shift register units includes a D flip-flop.

7. The memory device of claim 4,
wherein the second pipe output signal generation circuit comprises M second shift register units electrically coupled to one another in a ring shape,
wherein the M second shift register units perform a shift operation when the area selection signal among the N area selection signals corresponding to the first reference memory area is activated, and
output signals of the M second shift register units are the second pipe output signals.

8. The memory device of claim 7, wherein each of the M second shift register units includes a D flip-flop.

9. The memory device of claim 7, wherein the second pipe output signal generation circuit further comprises a blocking unit suitable for preventing shift operations of the M second shift register units before data of the second group is initially outputted when data of the first group is to be outputted prior to the data of the second group.

10. The memory device of claim 1, wherein each of the N memory areas includes a memory bank.

* * * * *